United States Patent
Castonguay et al.

(10) Patent No.: US 11,284,208 B2
(45) Date of Patent: Mar. 22, 2022

(54) SYSTEM AND A METHOD FOR DETECTING LOUDSPEAKER CHAIN FAILURE

(71) Applicant: SYSTÈMES DE CONTRÔLE ACTIF SOFT DB INC., Quebec (CA)

(72) Inventors: David Castonguay, Breakeyville (CA); Alex Boudreau, Sherbrooke (CA)

(73) Assignee: SYSTÈMES DE CONTRÔLE ACTIF SOFT DB INC.

( * ) Notice: Subject to any disclaimer, the term of this patent is extended or adjusted under 35 U.S.C. 154(b) by 0 days.

(21) Appl. No.: 16/899,364

(22) Filed: Jun. 11, 2020

(65) Prior Publication Data

US 2020/0396554 A1 Dec. 17, 2020

Related U.S. Application Data

(60) Provisional application No. 62/860,900, filed on Jun. 13, 2019.

(51) Int. Cl.
*H03F 3/183* (2006.01)
*H04R 29/00* (2006.01)

(52) U.S. Cl.
CPC ........... *H04R 29/001* (2013.01); *H03F 3/183* (2013.01); *H03F 2200/03* (2013.01)

(58) Field of Classification Search
CPC ........... H03F 2200/03; H03F 2200/321; H03F 2200/462; H03F 3/183; H03F 3/187; H03F 3/68; H03F 3/72; H04R 29/001; H04R 29/007
USPC ......................................................... 381/59
See application file for complete search history.

(56) References Cited

U.S. PATENT DOCUMENTS

| | | | |
|---|---|---|---|
| 5,361,305 A | 11/1994 | Easley et al. | |
| 5,631,566 A | 5/1997 | Person et al. | |
| 7,911,353 B2 | 3/2011 | Bedingfield | |
| 9,060,218 B2 | 6/2015 | Itou | |
| 9,565,504 B2 | 2/2017 | Miyata et al. | |
| 2007/0182486 A1* | 8/2007 | Chieng | H03F 1/52 330/207 P |
| 2012/0243696 A1 | 9/2012 | Brockelsby | |
| 2016/0192101 A1* | 6/2016 | Park | H04R 29/007 381/55 |
| 2019/0214951 A1* | 7/2019 | Baretich | H03F 1/0227 |

* cited by examiner

*Primary Examiner* — Nivian C Chin
*Assistant Examiner* — Friedrich Fahnert
(74) *Attorney, Agent, or Firm* — Lavery, De Billy, LLP; Gwendoline Bruneau (57) ABSTRACT

A method and a system for monitoring operation of at least one loudspeaker in a system comprising a plurality of loudspeakers connected in series on a same amplifier output in at least one loudspeaker chain driven by an amplifier board, the method comprising measuring a current consumed by the amplifier in an operating position of the plurality of loudspeakers, yielding a reference current; stopping the masking system into an idle position; emitting the reference signal, measuring an idle current consumed by the amplifier; and comparing the idle current with the reference current. The system comprises a microprocessor unit and a current measurement module, wherein the current measurement module is configured to measure a current drawn by the amplifiers and feed a resulting signal to the microprocessor unit; and the microprocessor unit generates an output signal to respective output channel.

19 Claims, 5 Drawing Sheets

FIG_1

SYSTEM AND A METHOD FOR DETECTING LOUDSPEAKER CHAIN FAILURE

CROSS REFERENCE TO RELATED APPLICATIONS

This application claims benefit of U.S. provisional application Ser. No. 62/860,900, filed on Jun. 13, 2019. All documents above are incorporated herein in their entirety by reference.

FIELD OF THE INVENTION

The present invention relates to loudspeaker chain failure. More precisely, the present invention relates to a system and a method for detecting loudspeaker chain failure.

BACKGROUND OF THE INVENTION

Sound masking and public address (PA) systems typically comprise a number of loudspeakers on a number of output channels.

Although a range of methods may be used for determining whether a loudspeaker chain is open or shorted, determining a connection problem on one or more loudspeakers on a long chain may still be a challenge. Typically, determining if loudspeakers are problematic in a long chain requires a precise measurement of the loudspeaker impedance, which involves costly electronic components, especially in case of multi-channel systems.

Most methods are limited to detection of an open or short circuit on the output of an amplifier. A number of methods use external microphones to determine problems with loudspeakers. These methods are complex, especially for a multi-channel or a large system, and they imply a significant increase of electronic components and increase in cost. Still other methods comprise using a complex analysis of the current signal measured during emission of alarms using pulse width modulation (PWM) signals. Such methods may not not applicable or not precise enough when dealing with a problem involving a single loudspeaker of a long chain. Moreover, these methods imply a higher electronic component count, which may be an issue for implementation in a multi-channel low-cost system.

There is still a need in the art for a system and a method for detecting loudspeaker chain failure.

SUMMARY OF THE INVENTION

More specifically, in accordance with the present invention, there is provided a controller/amplifier board for loudspeaker chains, comprising a number of output channels to as many loudspeaker chains, an amplifier for each one of the output channels; a microprocessor unit, and a current measurement module; wherein the current measurement module is configured to measure a current drawn by the amplifiers and feed a resulting signal to the microprocessor unit; and the microprocessor unit generates an output signal to the respective output channel.

There is further provided a method for monitoring a loudspeaker chains system, comprising measuring a reference idle current in an idle position of the system, generating a an output signal Voutput to each loudspeaker chain of the system and measuring a reference current Im on each loudspeaker chain, subtracting the reference idle current Iidle to the reference current Im at each loudspeaker chain to determine a current drawn by each loudspeaker chain and obtaining a reference impedance of each loudspeaker chain; and comparing of the reference impedance of each loudspeaker chain with a nominal impedance value of each loudspeaker chain; and above a threshold difference between the reference impedance and the nominal impedance, emitting a signal of failure of the loudspeaker chain.

There is further provided a method for monitoring operation of a loudspeaker chain driven by an amplifier of an amplifier board, comprising measuring an idle current consumption of the amplifier, selecting a stimulation low frequency; stimulating the loudspeaker chain at the selected stimulation low-frequency; measuring an operating current consumption of the amplifier; and comparing the operating current consumption with the idle current consumption.

There is further provided a method for monitoring disconnection of at least one loudspeaker in a sound masking system or a public address system comprising a plurality of loudspeakers connected in series on a same amplifier output, comprising measuring a current consumed by the amplifier in an operating position of the plurality of loudspeakers, yielding operating average reference current; stopping the masking system into an idle position; measuring an idle current consumed by the amplifier; and comparing the idle current with the reference current and, above a threshold difference value between the reference current and the idle current, emitting a signal of failure of the loudspeaker.

There is further provided a method for monitoring operation of at least one loudspeaker in a system comprising a plurality of loudspeakers connected in series on a same amplifier output in at least one loudspeaker chain driven by an amplifier board, comprising measuring a current consumed by the amplifier in an operating position of the plurality of loudspeakers, yielding a reference current; stopping the masking system into an idle position; emitting the reference signal, measuring an idle current consumed by the amplifier; and comparing the idle current with the reference current Other objects, advantages and features of the present invention will become more apparent upon reading of the following non-restrictive description of specific embodiments thereof, given by way of example only with reference to the accompanying drawings.

DESCRIPTION OF THE INVENTION

The present invention is illustrated in further detail by the following non-limiting examples.

Figure 1:
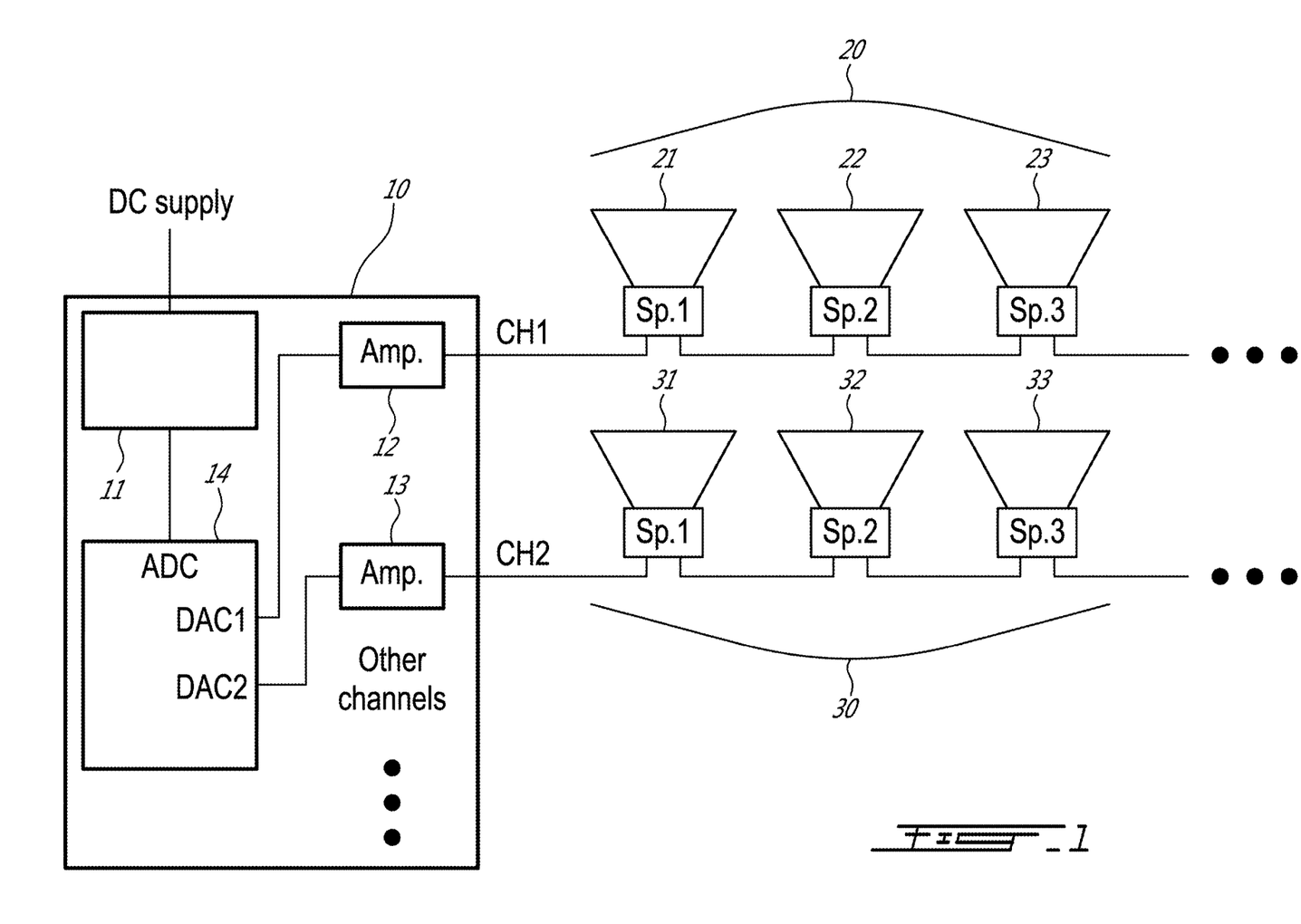
FIG. 1 is a schematical view of a system, according to an embodiment of an aspect of the present disclosure.

A according to an embodiment of an aspect of the present disclosure is illustrated for example in FIG. 1. The system comprises a controller/amplifier board 10, described in relation with FIG. 2 hereinbelow, and a number of output channels to as many loudspeaker chains, respectively.

Although only two output channels CH1, CH2 and two loudspeaker chains 20, 30 are shown for clarity, the system may comprise any number of output channels. The loudspeaker chains 20, 30 are shown as each comprising three loudspeakers Sp.1, Sp. 2 and Sp.3 (see 21, 22, 23 and 31, 32, 33) for clarity, although each loudspeaker chain may comprise a larger number of loudspeakers.

According to an embodiment of an aspect of the present disclosure, the controller/amplifier board 10 comprises a current measurement module 11 and a microprocessor unit 14 discussed in FIG. 2 hereinbelow.

Figure 2:
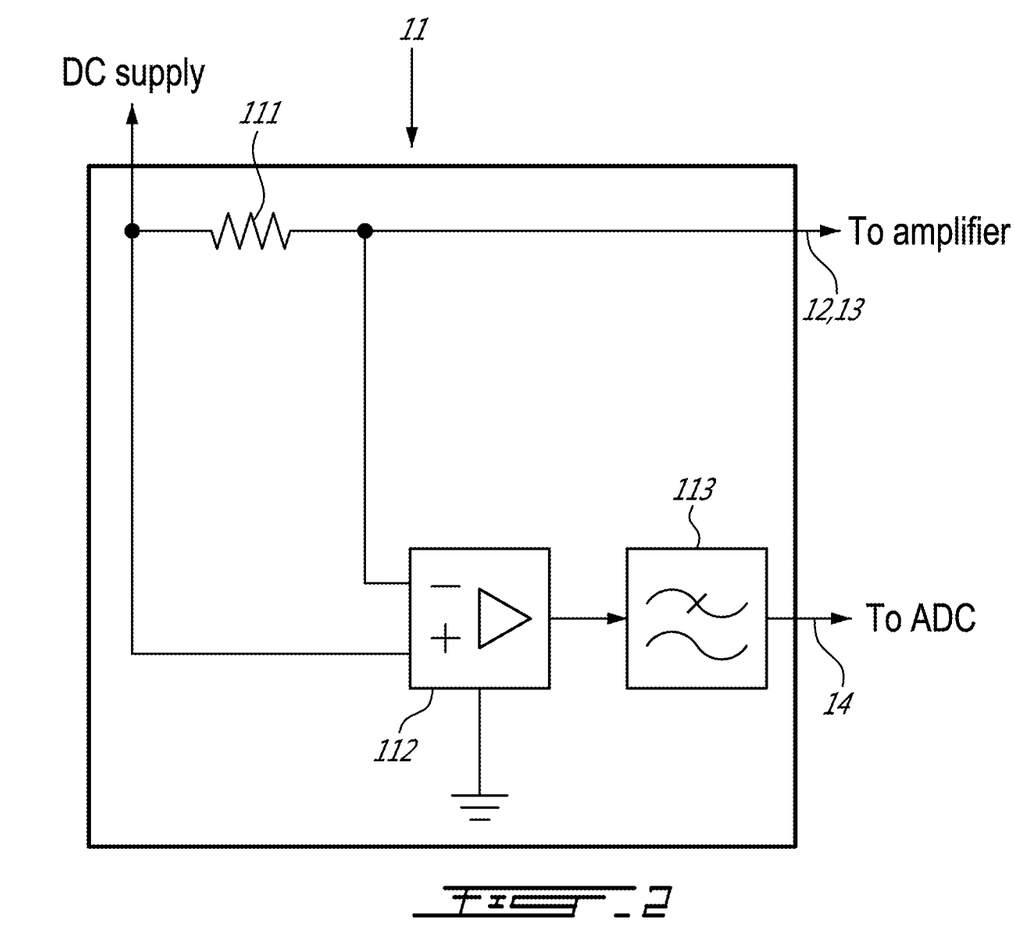
FIG. 2 is a schematical view of a current measurement module according to an embodiment of an aspect of the present disclosure.

As illustrated in FIG. 2, the current measurement module 11 comprises a current sensor or shunt resistor 111, inserted on the main DC amplifier supply line of the system. A current sense amplifier 112 with a fixed gain amplifies the voltage drop across the current sensor 111. The signal from the current sense amplifier 112 is then fed to an analog-to-digital converter (ADC) of the microprocessor unit (MCU) 14 of the system through a low-pass filter 113.

The microprocessor unit 14 is the main microprocessor of the system. The microprocessor unit 14 comprises one digital to analog converter DAC1, DAC2 by channel CH1, CH2, respectively, of the system, to generate the output signal to the respective loudspeaker chains 20, 30 of the system (FIG. 1), via amplifiers 12, 13 respectively.

In a nutshell, the method according to an aspect of the present disclosure is based on a precise current measurement of the power amplifier supply at low loudspeaker efficiency at low frequencies.

Figure 3:
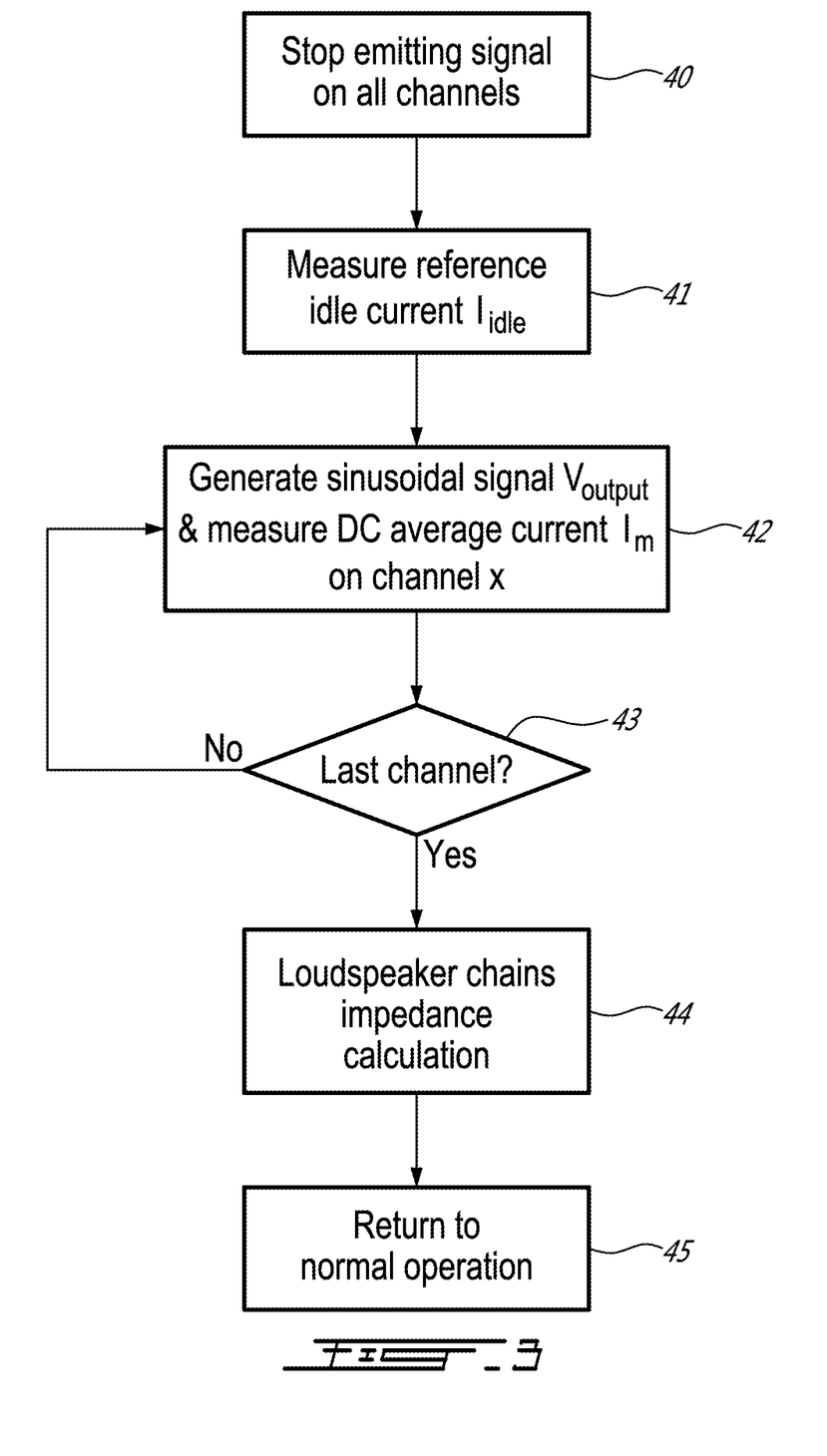
FIG. 3 is a flowchart of a method according to an embodiment of an aspect of the present disclosure.

FIG. 3 is a flowchart of a method according to an embodiment of an aspect of the present disclosure. Emission of signal, i.e. sound masking, music and paging, referred to as normal operation herein, is first stopped on all channels CH1, CH2, . . . of the system, setting the system in idle position.

An embedded firmware of the microprocessor unit 14 may be used to stop this normal operation of the sound masking or of the public address (PA) system, at a predetermined time, for example at a given moment in a day or in a week, for example (step 40).

The current drawn by the amplifier power supply is then measured: during a period of time, as short as 1 second, the microprocessor unit 14 performs a DC average of the measured current, to yield a reference idle current Iidle (step 41).

The microprocessor unit 14 then generates a low frequency sinusoidal signal $V_{output}$ to each output channel CH1, CH2, . . . of the system through each analog-to-digital converter (ADC) of the microprocessor unit 14 successively, on one output channel at a time (see loop between 42 and 43). During the emission of the signal $V_{output}$, a DC average current $I_m$ on the amplifier supply voltage is measured for each channel (step 42). A period of measurement as short as 1 second is sufficient. The amplitude of the low frequency sinusoidal signal $V_{output}$ is adjusted to obtain a good and strong signal at the current measurement module 11 of the microprocessor unit 14.

Figure 4:
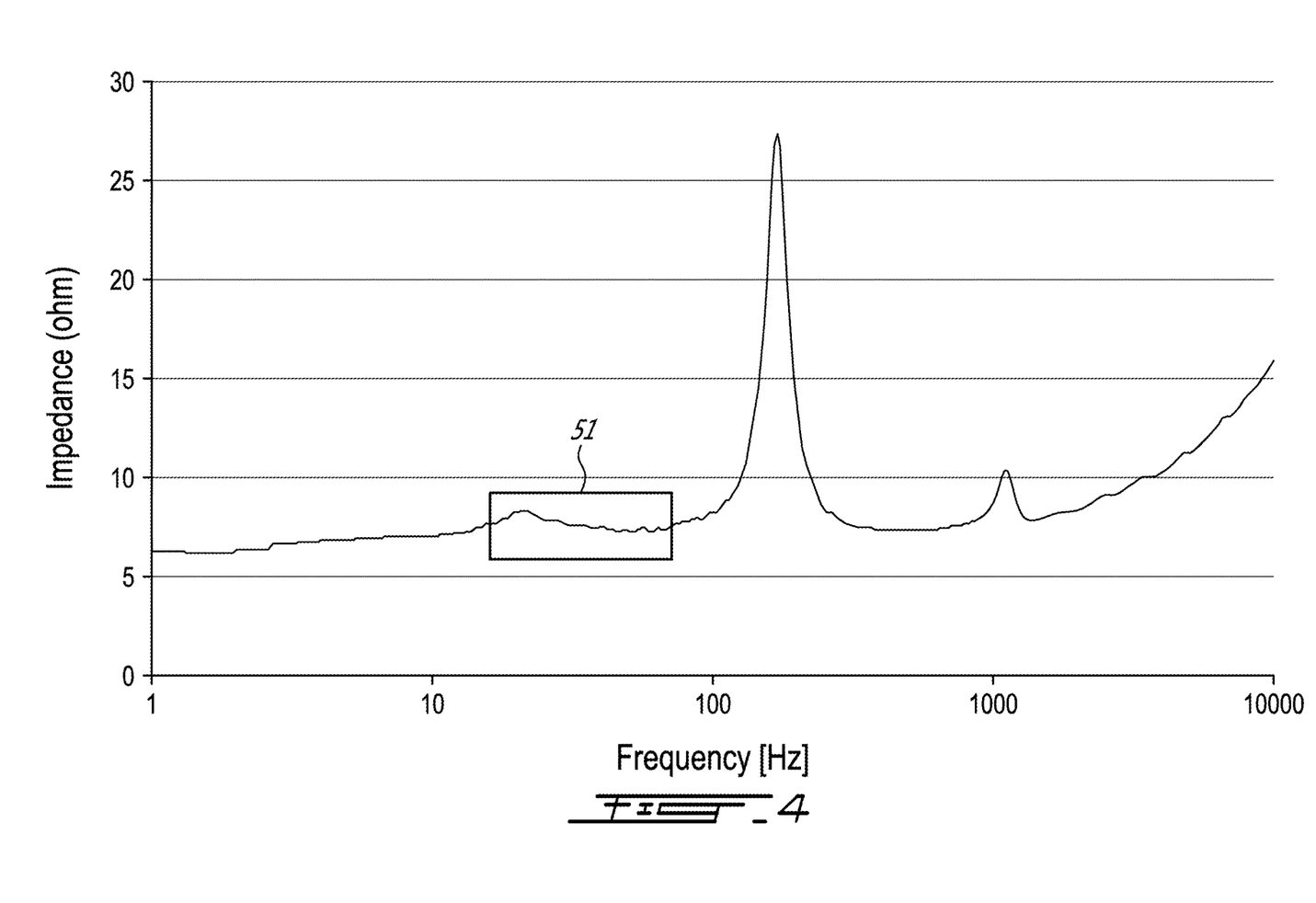
FIG. 4 shows loudspeaker impedance in function of frequency.

The frequency of the signal $V_{output}$ is selected to allow a high current and a low acoustical emission. The inefficiency of the loudspeakers at low frequency allows overcoming the current noise because a small sinusoidal signal generates a large current signal at the measurement module 11. FIG. 4 shows a typical impedance frequency response of a loudspeaker, showing a zone 51 of the spectrum of a frequency range that may be used. Impedance between 4 and 8 ohms typically allows a large current drawn and a precise measurement, i.e. with a high signal-to-noise ratio.

In the system as described hereinabove in relation to FIGS. 1 and 2, one single current measurement module, which can measure the current drawn by each amplifier individually, is used when only one output channel is used during the current measurement (STEP 41) described hereinabove, which results in a low-cost solution for detecting loudspeaker chain failure on a multi-channel system.

Step 42 is repeated on all channels in a similar way. When the DC average current $I_m$ of the last channel of the system has thus been measured, the impedance of each loudspeaker chain of the system may be determined as follows (step 44):

Impedance=$V_{output}/I_{output}$ where $V_{output}$ is the voltage applied on each output channel of the system through the digital to analog converter (DAC) during step 42 and estimated with the DAC output voltage and the amplifier gain; $I_{output}=(V_{supply}/V_{output})*(I_m-I_{idle})*Amp_{eff}$; where $V_{supply}$ is the DC supply voltage of the amplifier; $I_m$ is the average current measured at step 42; Iidle is the average current measured at step 41; and $Amp_{eff}$ is the efficiency of the amplifier, for example 90% for a typical Class-D amplifier. Thus, the reference idle current Iidle measured at step 41 is subtracted to the average current $I_m$ measured at step 42 to determine the current drawn by each loudspeaker chain.

Comparison of the measured impedance of each loudspeaker chain with the value of the loudspeaker chain as specified by manufacturers then allows detecting a problem with one or more loudspeakers on the chain, provided that the efficiency $Amp_{eff}$ of the amplifier and the theoretical values, as specified by manufacturers for example, of the loudspeaker impedance are known. Above a threshold difference value between the measured impedance and the impedance as provided by specifications, a signal is emitted of failure of the loudspeaker chain.

The threshold difference is determined depending on the loudspeaker system and its application, by determining the impact on the impedance of a loudspeaker chain when at least one loudspeaker is badly connected. For example for a loudspeaker chain comprising 6 loudspeakers at 32 ohms connected in parallel, the equivalent impedance when the six loudspeakers on the chain are functional is: 32/6: 5.33 ohms; while when one of the loudspeaker is badly connected, the equivalent impedance is 6.4 ohms, i.e. increased by 20%. Thus, in this example with six loudspeakers on the chain, a difference value of 20% and more in impedance may be selected as the threshold difference for detecting a connection problem on the chain with at least one loudspeaker.

In case the theoretical values of the loudspeakers are not known, following step 43, the system is operated again, with signal emission, and operating current measurements are performed as described hereinabove, yielding average operating currents, which may be compared to the initial reference average current measurement $I_m$ to determine if the loudspeaker chain is properly functioning. Above a threshold difference value between the initial reference average current measurement $I_m$ and the operating current measurement, a signal is emitted of failure of the loudspeaker chain.

The threshold difference is determined depending on the loudspeaker system and its application, by calculating the impact on the impedance of the loudspeaker chain when at least one loudspeaker is badly connected. In the example of a chain of six loudspeakers at 32 ohms connected in parallel discussed hereinabove, using the relation V=RI and setting V to 10V for example, the current measurement when the six loudspeakers are functional is 10/5.33: 1.8762; and when only five are functional is: 10/6.4: 1.5625 A, which is −16.66%.

Thus, in this example with six loudspeakers on the chain, a difference value of −16.66% and less in impedance may be selected as the threshold difference for detecting a connection problem on the chain.

In an embodiment of an aspect of the present method, the measurement module 11 is used in normal operation of the system to monitor the global power consumption of the amplifiers of the system. If the global current is larger than a determined threshold, the microprocessor unit 14 of the system may reduce the output volume and emit a signal informing the user that the system is working over its limit.

The present method allows monitoring loudspeaker failures, by detecting disconnection of one or more loudspeakers in a chain, in sound masking systems comprising a number of speakers connected in series on a same amplifier output for example. The current consumed by the amplifier for a reference signal of the chain when the speakers are normally connected is measured, yielding a reference current. Then, periodically, the masking system processor stops masking, emits the reference signal, measures the current consumed and compares this current with the reference current.

Figure 5:
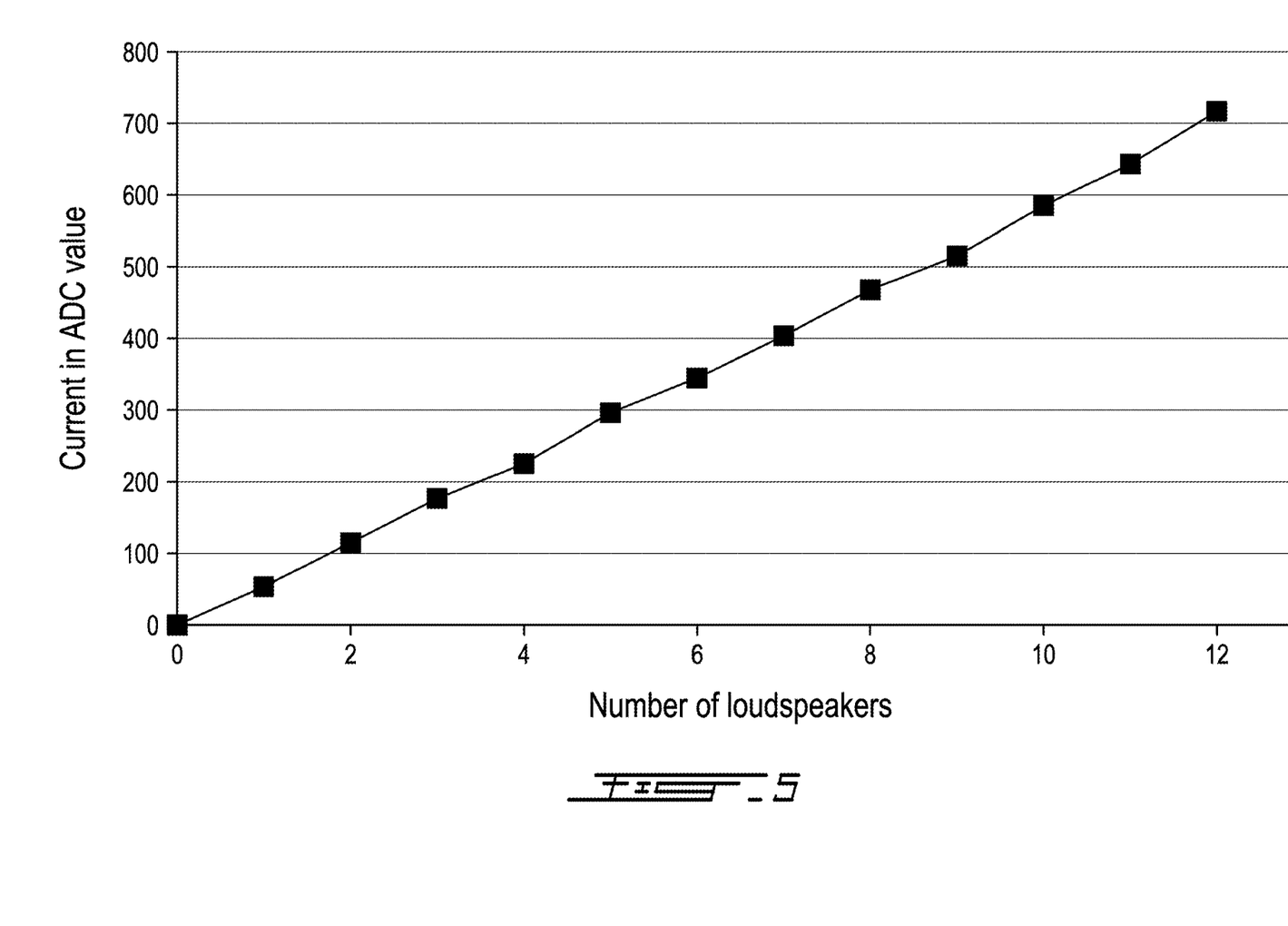
FIG. 5 shows measured current in ADC values versus the number of loudspeakers in a chain, according to an embodiment of an aspect of the present disclosure.

Tests showed that current measurements as described in steps 41 and 42 above yield a high signal-to-noise ratio, hence precision for detecting a problem with one loudspeaker of a long chain of 12 loudspeakers for example. FIG. 5 shows the curve of the measured currents, in 12-bits ADC values between 0 and 4096, versus the number of loudspeakers. An additional count of 64 on the ADC scale was measured for each loudspeaker added in the chain, which is very good in comparison with the measurement noise: a count of 64 on the ADC scale represents 6-bits of resolution on the total 12-bits of the ADC.

There is thus provided a method to determine operating problems on a loudspeaker chain, based on measuring current consumption at one point in the system, i.e. current consumption of the amplifiers board as described hereinabove, as opposed to at each channel of the system.

The method comprises using low frequency stimulations on each loudspeaker chain to obtain a precise measurement of the amplifier current consumption of the chain. The frequency may be comprised in the range between about 40 Hz and about 60 Hz for a typical standard full range electrodynamic loudspeaker as illustrated in FIG. 4 for example. Lower frequencies, for example down to 20 Hz, may be used in case of a subwoofer or higher for a tweeter. Higher frequencies up to 100 Hz for example, may be used, where the loudspeakers are not efficient due to their low impedance, and the current signal is strong and thus easy to measure. Interestingly, in this frequency range, since the loudspeakers are much less efficient, with typically less sound per watt in low frequency, the acoustical disturbance in a room is low, and the sensitivity of human hear is very low, at frequencies of about 60 Hz and below. Thus, the method is precise enough to allow problem detection on a single loudspeaker on a long chain of several loudspeakers, as well as quiet enough for non-intrusive in-situ diagnostic of loudspeaker problems.

Moreover, the present method and system are cost-efficient and additional channels do not imply additional cost, as the present method and system are independent of the number of channels. They thus provide a low-cost solution for a multi-channel sound masking or public address (PA) system.

Because the method is based on the use of low frequency signals combined with the low efficiency of loudspeakers in this range of frequency, increased precision of the current measurement is obtained compared to standard methods. When stimulating the loudspeakers with a low frequency, thus in the frequency range where the loudspeakers impedance is very low, a high current is measured, which allows a precise measurement at low cost and with simple electronic components. The method is precise enough to determine a problem of any single loudspeaker of a long chain as opposed to only determine if the chain is a short or an open circuit.

The use of low frequencies to stimulate the loudspeaker chain where the loudspeakers are not efficient allows a discreet and an in-situ failure detection method.

The present method comprises measuring the loudspeaker chain impedance and comparing the measured loudspeaker chain impedance with the theoretical loudspeaker chain impedance so as to detect a problem in the loudspeaker chain. If the amplifier efficiency and/or the theoretical loudspeaker chain impedance are not known, an initial reference current measurement is done after the installation of the sound masking or the public address (PA) system. Then, further measurements and comparisons with the reference allow detecting a problem in the loudspeaker chain.

As people in the art will appreciate, in the present method, the current signal strength is maximized by taking advantage of the fact that the loudspeakers are very ineffective at low frequency, and accurate current measurements are obtained with low-cost electronics. The precision of the current measurements makes it possible to detect a failure of a loudspeaker on a long chain of several loudspeakers. Moreover, measuring the current at ineffective frequencies of the loudspeakers makes it possible to avoid emitting disturbing signals for occupants of the room during the tests since the acoustic signal is weak. Also, by measuring the current in one point of the system, i.e. the power supply to the amplifiers as described hereinabove, the material cost for multichannel systems is minimized.

The present method allows measuring the impedance of the loudspeaker chain, which makes it possible to detect a problem by comparing the measured impedance with the impedance specified by manufacturers. A reference measurement of the speaker chain impedance may also be used to detect problems in case the impedance specified by manufacturers is not known.

The current measurement on the power supply of the amplifiers may also be used in normal operation of the system to monitor and limit the overall power of the system and/or trigger a protection procedure in case of a connection problem, such as a short circuit of one of the outputs for example.

The scope of the claims should not be limited by the illustrated embodiments set forth in the examples, but should be given the broadest interpretation consistent with the description as a whole.

The invention claimed is:

1. A controller/amplifier board for a system comprising loudspeaker chains, comprising:
    a current measurement module on a DC amplifier supply line of the system; and
    a microprocessor unit;
    wherein, for monitoring the loudspeaker chains, said current measurement module is configured to measure an idle current $I_{idle}$ drawn by an amplifier power supply in absence of emission of signal, and a stimulated current $I_m$, drawn by the amplifier power supply during emission of a stimulation signal by the microprocessor unit at a respective output channel via a respective amplifier to each loudspeaker chain of the system; and said microprocessor unit determines an impedance of each loudspeaker chain from the idle current $I_{idle}$ and the stimulated current $I_m$, compares the determined impedance with a nominal impedance of the loudspeaker chains, and, above a threshold difference between the nominal impedance and the determined impedance, emits a signal of failure of the loudspeaker chain.

2. The controller/amplifier board of claim 1, wherein said current measurement module comprises a current sensor inserted on the DC amplifier supply line; the microprocessor unit receiving a signal from the current sense amplifier.

3. The controller/amplifier board of claim 1, wherein said current measurement module comprises a current sense amplifier and said current sense amplifier amplifies a voltage drop across the current sensor with a fixed gain.

4. A method for monitoring a loudspeaker chains system, comprising:
Measuring by a current measurement unit an idle current $I_{idle}$ drawn by an amplifier power supply of the system in absence of emission of signal;
measuring b the current measurement unit a stimulation current $I_m$ during emission of a stimulation signal $V_{output}$ to each loudspeaker chain of the system;
determining by a microprocessor unit an impedance of each loudspeaker chain;
comparing by the microprocessor unit of the determined impedance of each loudspeaker chain with a nominal impedance each loudspeaker chain; and
if the difference between the determined impedance and the nominal impedance is above a threshold emitting a signal of failure of the loudspeaker chain.

5. The method of claim 4, comprising determining the impedance of the loudspeaker chains from a supply voltage of the system ($V_{supply}$), the stimulation signal $V_{output}$, the stimulation current $I_m$, measured at each loudspeaker chain, the reference idle current $I_{idle}$ and an efficiency of the loudspeaker chains of the system.

6. The method of claim 4, wherein the stimulation signal is a low frequency signal selected to optimize the stimulation current $I_m$.

7. The method of claim 4, comprising using the following relation:
Impedance=$V_{output}$ / $I_{output}$
with $I_{output}=(V_{supply}/V_{output})*(I_m - I_{idle}) * Amp_{eff}$; where $V_{supply}$ is DC supply voltage of the amplifier; and $Amp_{eff}$ is efficiency of amplifiers of the loudspeaker chains.

8. The method of claim 4, wherein the nominal impedance of each loudspeaker chain is specified by manufacturers.

9. The method of claim 4, comprising, after said measuring the stimulation current $I_m$, on each loudspeaker chain; setting the system in an operating position and measuring operation current of each loudspeaker chain and comparing the operation current to the idle current $I_{idle}$; and, above a threshold difference, emitting a signal of failure of the loudspeaker chain.

10. The method of claim 4, wherein the stimulation signal $V_{output}$ is a low frequency sinusoidal signal stimulating each chain successively.

11. The method of claim 4, wherein the stimulation signal $V_{output}$ is selected as a low frequency sinusoidal signal.

12. The method of claim 4, wherein said generating the stimulation signal $V_{output}$ is selected as a low frequency sinusoidal signal maximizing the stimulation current.

13. A method for monitoring a problem with a least one loudspeaker in a system comprising a chain of loudspeakers connected in parallel on a same amplifier output, comprising:
measuring by a current measurement unit a current consumed by the amplifier in absence of output signal emitted, yielding an idle current consumption of the amplifier;
measuring b the current measurement unit a current consumed by the amplifier when emitting a low frequency signal to the loudspeakers chain, yielding a stimulation current consumption of the amplifier;
determining by a microprocessor unit an impedance of the loudspeaker chain from the idle current consumption and the stimulation current consumption and comparing by the microprocessor unit the impedance with a nominal impedance of the loudspeaker chain and if the difference is above a threshold signaling failure of the loudspeaker.

14. The method of claim 13, comprising measuring the current consumed by the amplifier in the absence of output signal emitted, selecting a stimulation low frequency; stimulating the chains of loudspeakers at the selected stimulation low-frequency; measuring a resulting stimulation current consumption of the amplifier; and comparing the stimulation current consumption with the current consumed by the amplifier in the absence of output signal emitted.

15. The method of claim 13, comprising measuring the current consumed by the amplifier in the absence of output signal emitted, selecting a stimulation low frequency; stimulating the chains of loudspeakers at the selected stimulation low-frequency; measuring a resulting stimulation current consumption of the amplifier; and comparing the stimulation current consumption with the current consumed by the amplifier in the absence of output signal emitted, wherein said selecting the stimulation low frequency comprises selecting a low frequency maximizing the measured stimulation current.

16. The method of claim 13, comprising measuring the current consumed by the amplifier in the absence of output signal emitted, selecting a stimulation low frequency; stimulating the chains of loudspeakers at the selected stimulation low-frequency; measuring a resulting stimulation current consumption of the amplifier; and comparing the stimulation current consumption with the current consumed by the amplifier in the absence of output signal emitted, wherein said selecting the low frequency comprises selecting a frequency at a frequency range between about 20 Hz and about 100 Hz.

17. The method of claim 13, comprising measuring the current consumed by the amplifier in the absence of output signal emitted, selecting a stimulation low frequency; stimulating the chains of loudspeakers at the selected stimulation low-frequency; measuring a resulting stimulation current consumption of the amplifier; and comparing the stimulation current consumption with the current consumed by the amplifier in the absence of output signal emitted, wherein said selecting the low frequency comprises selecting a frequency at a frequency range between about 20 Hz and about 60 Hz.

18. The method of claim 13, comprising measuring the current consumed by the amplifier in the absence of output signal emitted, selecting a stimulation low frequency; stimulating the chains of loudspeakers at the selected stimulation low-frequency; measuring a resulting stimulation current consumption of the amplifier; and comparing the stimulation current consumption with the current consumed by the amplifier in the absence of output signal emitted, wherein said selecting the low frequency comprises selecting a frequency at a frequency range between about 40 Hz and about 60 Hz.

19. The method of claim 13, comprising measuring the current consumed by the amplifier in the absence of output signal emitted, selecting a stimulation low frequency; stimulating the chains of loudspeakers at the selected stimulation low-frequency; measuring a resulting stimulation current consumption of the amplifier; and comparing the stimulation current consumption with the current consumed by the amplifier in the absence of output signal emitted, wherein said selecting a stimulation signal comprises selecting a frequency maximizing high current and a low acoustical emission and an amplitude maximizing current.

\* \* \* \* \*